(12) United States Patent
Akahane

(10) Patent No.: US 10,193,542 B2
(45) Date of Patent: Jan. 29, 2019

(54) SEMICONDUCTOR DEVICE

(71) Applicant: Fuji Electric Co., Ltd., Kanagawa (JP)

(72) Inventor: Masashi Akahane, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/891,188

(22) Filed: Feb. 7, 2018

(65) Prior Publication Data

US 2018/0167063 A1 Jun. 14, 2018

Related U.S. Application Data

(63) Continuation of application No. PCT/JP2017/000049, filed on Jan. 4, 2017.

(30) Foreign Application Priority Data

Feb. 16, 2016 (JP) .................. 2016-027094

(51) Int. Cl.
*H03K 17/10* (2006.01)
*H02M 1/08* (2006.01)
*H02M 1/088* (2006.01)
*H02M 7/538* (2007.01)

(52) U.S. Cl.
CPC ............ *H03K 17/102* (2013.01); *H02M 1/08* (2013.01); *H02M 1/088* (2013.01); *H02M 7/538* (2013.01); *H03K 2217/0081* (2013.01)

(58) Field of Classification Search
CPC .............................. H03K 17/10; H03K 17/102
USPC .......................................... 327/108, 109, 112
See application file for complete search history.

(56) References Cited

U.S. PATENT DOCUMENTS

| 5,963,066 | A | 10/1999 | Fukunaga |
| 7,268,596 | B2 * | 9/2007 | Ota .................. H03K 17/04206 327/112 |
| 7,859,138 | B2 | 12/2010 | Iwabuchi et al. |
| 8,724,357 | B2 | 5/2014 | Imanishi et al. |

(Continued)

FOREIGN PATENT DOCUMENTS

| JP | 5-41397 U | 6/1993 |
| JP | 10-285949 A | 10/1998 |

(Continued)

OTHER PUBLICATIONS

International Search Report (ISR) issued in PCT/JP2017/000049 dated Feb. 2017.

(Continued)

*Primary Examiner* — Hai L Nguyen
(74) *Attorney, Agent, or Firm* — Chen Yoshimura LLP

(57) ABSTRACT

A semiconductor device includes: a bootstrap capacitor charged via a diode when a low-side switching device is ON, a resulting charge voltage being applied to a high-side driver circuit when the low-side switching device is OFF; a supplementary bootstrap capacitor charged when the low-side switching device is OFF; a Zener diode that regulates a charge voltage of the supplementary bootstrap capacitor; and a control circuit that applies the charge voltage of the supplementary bootstrap capacitor to the high-side driver circuit via a switch circuit when the charge voltage of the bootstrap capacitor decreases to less than a prescribed voltage while a high-side switching device is ON.

11 Claims, 12 Drawing Sheets

(56) References Cited

U.S. PATENT DOCUMENTS

| | | | |
|---|---|---|---|
| 9,641,169 B2* | 5/2017 | Boguszewicz | H03K 17/567 |
| 2009/0160534 A1 | 6/2009 | Jansen | |
| 2013/0119965 A1 | 5/2013 | Marvin et al. | |

FOREIGN PATENT DOCUMENTS

| | | |
|---|---|---|
| JP | 11-69842 A | 3/1999 |
| JP | 2002-330064 A | 11/2002 |
| JP | 2003-018821 A | 1/2003 |
| JP | 2005-151722 A | 6/2005 |
| JP | 2007-6207 A | 1/2007 |
| JP | 2011-234430 A | 11/2011 |
| JP | 2013-55549 A | 3/2013 |
| JP | 2013-532945 A | 8/2013 |

OTHER PUBLICATIONS

Written Opinion (PCT/ISA/237) issued in PCT/JP2017/000049 dated Feb. 2017. (Concise Explanation of Relevance: This Written Opinion considers that the some claims are not described by or obvious over the U.S. Patent Pub No. 2 and Foreign patent documents No. 4-6 cited in ISR above.).
English translation of Written Opinion (PCT/ISA/237) issued in PCT/JP2017/000049 dated Feb. 2017.

* cited by examiner

SEMICONDUCTOR DEVICE

BACKGROUND OF THE INVENTION

Technical Field

The present invention relates to a semiconductor device including a high-side driver circuit and a low-side driver circuit which drive a totem pole-connected high-side switching device and low-side switching device in a complementary manner.

Background Art

FIG. 11 schematically illustrates the configuration of a power converter including a totem pole-connected high-side switching device XM1 and low-side switching device XM2. This power converter functions as a DC/AC converter which generates AC power for a load RL by alternately outputting a DC voltage HV and a ground voltage to the load RL via the switching devices XM1 and XM2, which are switched ON and OFF in a complementary manner.

A semiconductor device 1 which includes a high-side driver circuit 11 and a low-side driver circuit 12 and switches the switching devices XM1 and XM2 ON and OFF in a complementary manner is implemented as an intelligent power module (IPM), for example. This semiconductor device 1 further includes an interface circuit 13 which generates a high-side drive signal and a low-side drive signal in a complementary manner in accordance with a control signal IN input from a controller 2 (an external device). The high-side driver circuit 11 switches the high-side switching device XM1 ON and OFF in accordance with the high-side drive signal, and the low-side driver circuit 12 switches the low-side switching device XM2 ON and OFF in accordance with the low-side drive signal. The high-side drive signal generated by the interface circuit 13 is input to the high-side driver circuit 11 via a level shifter circuit 14.

Here, the low-side driver circuit 12 and the interface circuit 13 receive and operate on a prescribed supply voltage VCC, with a ground voltage GND as a reference voltage. The high-side driver circuit 11 uses an intermediate voltage VS at a series connection node between the switching devices XM1 and XM2 as a reference voltage and receives and operates on a boosted supply voltage VB generated by boosting (bootstrapping) the supply voltage VCC in a bootstrap circuit constituted by a bootstrap diode Dbs and a bootstrap capacitor Cbs.

The bootstrap circuit charges the bootstrap capacitor Cbs with the supply voltage VCC when the low-side switching device XM2 is ON. When the low-side switching device XM2 switches OFF, the bootstrap circuit utilizes the increase in the intermediate voltage VS (the low-voltage side terminal voltage of the bootstrap capacitor Cbs) that occurs as the high-side switching device XM1 switches ON to thereby generate the boosted (bootstrapped) supply voltage VB.

Typically, in the semiconductor device 1 configured as described above, if the ON time of the high-side switching device XM1 is long, for example, decreases in the charge stored in the bootstrap capacitor Cbs become more pronounced, and it may not be possible to maintain the supply voltage VB required to drive the high-side driver circuit 11.

To solve this problem, Patent Document 1, for example, discloses supplying current to the bootstrap capacitor Cbs from a floating power supply FV (which uses a high-voltage side voltage as a reference voltage) when the low-side switching device XM2 is OFF (see FIG. 1 in Patent Document 1). However, the configuration disclosed in Patent Document 1 requires preparing the floating power supply FV and creates problems such as increases in cost and how to configure the floating power supply FV itself in the first place.

Furthermore, Patent Document 2 discloses charging the bootstrap capacitor Cbs directly from the high-voltage DC voltage HV via a resistor R1 when the low-side switching device XM2 is OFF (see FIG. 1 in Patent Document 2). However, the configuration disclosed in Patent Document 2 creates a problem where when the high-side switching device XM1 is ON, the DC voltage HV and the intermediate voltage VS take substantially the same voltage, and the resistor R1 becomes a load for the supply voltage VB and discharges the charge stored in the bootstrap capacitor Cbs.

Moreover, when the low-side switching device XM2 is ON, the intermediate voltage VS and the ground voltage GND take substantially the same voltage, thereby causing the charging current of the bootstrap capacitor Cbs to increase. In addition, a clamp current flowing through a Zener diode for regulating the charge voltage of the bootstrap capacitor Cbs also increases. As a result, the power consumption of the bootstrap circuit increases, and it becomes more difficult to miniaturize the semiconductor device 1.

As illustrated in FIG. 12, to address this, Patent Document 3 discloses charging a first-stage capacitor C1 with the supply voltage VCC via switching devices Qn1 and Qn2 and then charging a second-stage capacitor C2 with the charge voltage of the capacitor C1 via switching devices Qp1 and Qp2. In the configuration disclosed in Patent Document 3, under the control of a control circuit 15, the switching devices Qn1 and Qn2 and the switching devices Qp1 and Qp2 are switched ON and OFF in a complementary manner independently of the ON/OFF operation of the switching devices XM1 and XM2, thereby generating the supply voltage VB as the charge voltage of the second-stage capacitor C2. Therefore, even when the OFF time of the low-side switching device XM2 is long, it is possible to maintain the supply voltage VB required to drive the high-side driver circuit 11.

RELATED ART DOCUMENTS

Patent Documents

Patent Document 1: Japanese Patent Application Laid-Open Publication No. 2011-234430

Patent Document 2: Japanese Patent Application Laid-Open Publication No. 2013-55549

Patent Document 3: Japanese Patent Application Laid-Open Publication No. 2007-6207

SUMMARY OF THE INVENTION

However, in the configuration disclosed in Patent Document 3, in order to switch the second-stage switching devices Qp1 and Qp2 ON and OFF, a level shifter circuit must be included within the control circuit 15. Moreover, the intermediate voltage VS becomes equal to the high-voltage DC voltage HV and the ground voltage GND as the switching devices XM1 and XM2 are switched. When the intermediate voltage VS takes a high voltage, the supply voltage VB also takes a high voltage.

In order to isolate and protect the power supply which supplies the supply voltage VCC to the switching devices Qn1 and Qn2 from these high voltages, a high breakdown voltage device must be used for each of the switching devices Qn1, Qn2, Qp1 and Qp2. Moreover, the level shifter circuit must similarly be configured using high breakdown voltage devices. This increases the complexity of the bootstrap circuit configuration and also results in an unavoidable increase in component costs due to the use of high breakdown voltage devices.

The present invention was made in light of the foregoing and aims to provide a semiconductor device having a simple, low-cost configuration including a bootstrap circuit which, even when the ON time of a high-side switching device is long, makes it possible to stably supply power to a high-side driver circuit that switches the high-side switching device ON and OFF.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides: a semiconductor device for driving a high-side switching device and a low-side switching device ON and OFF in a complementary manner, the high-side switching device and the low-side switching device being totem pole-connected with a node therebetween to be connected to a load to drive the load, the semiconductor device including: a high-side driver circuit and a low-side driver circuit which respectively switch the high-side switching device and the low-side switching device ON and OFF in a complementary manner; a bootstrap capacitor connected to a power supply that supplies driving power to the low-side driver circuit via a diode such that the bootstrap capacitor is charged when the low-side switching device is ON, and a resulting charge voltage is boosted and applied to the high-side driver circuit when the low-side switching device is OFF.

In particular, in order to achieve the abovementioned objectives, the semiconductor device according to the present disclosure further includes, in addition to the configuration described above: a supplementary bootstrap capacitor connected in parallel to the bootstrap capacitor via a switch circuit such that the supplementary bootstrap capacitor is charged by an intermediate voltage at an intermediate node between the high-side and low-side driver circuits that is to be connected to said node between the high-side switching device and the low-side switching device when the high-side switching device is ON; a Zener diode that is connected to the intermediate node and that regulates a charging voltage of the supplementary bootstrap capacitor; and a control circuit that controls the switch circuit so as to apply a charge voltage of the supplementary bootstrap capacitor to the high-side driver circuit when the charge voltage of the bootstrap capacitor decreases to less than a prescribed voltage while the high-side switching device is ON.

In other words, the semiconductor device according to the present invention includes, in parallel with the bootstrap capacitor which is charged when the low-side switching device is ON, the supplementary bootstrap capacitor which is charged when the low-side switching device is OFF. Moreover, when an ON time of the high-side switching device is long, the charge voltage of the supplementary bootstrap capacitor is used to compensate for any decrease in the voltage applied to the high-side driver circuit from the bootstrap capacitor.

Here, the high-side driver circuit may be configured to operate using a voltage of the intermediate node as an operating voltage, and wherein the Zener diode sets the charging voltage of the supplementary bootstrap capacitor that is charged by the intermediate voltage to a voltage of the power supply that supplies the driving power to the low-side driver circuit. Furthermore, the control circuit may determine that the charge voltage of the bootstrap capacitor has decreased to less than the prescribed voltage when the ON time of the high-side switching device exceeds a prescribed time.

The switch circuit may include first and second switches which connect the supplementary bootstrap capacitor to power supply lines for the high-side driver circuit in parallel when the charge voltage of the bootstrap capacitor decreases to less than the prescribed voltage while the high-side switching device is ON, as well as third and fourth switches which apply the charging voltage to the supplementary bootstrap capacitor when the high-side switching device is ON and the first and second switches are OFF, for example. Bidirectional analog switches may be used for the first to fourth switches, for example.

Moreover, The control circuit may be configured to operate using the intermediate voltage at the series connection intermediate node that is to be connected to the node between the totem pole-connected high-side switching device and low-side switching device as an operating voltage. In particular, the control circuit may be configured to include a voltage decrease detector which outputs a voltage decrease detection signal upon detecting a decrease in a supply voltage applied to the high-side driver circuit, as well as a control logic circuit which, on the basis of the voltage decrease detection signal, generates switching signals for respectively switching the first to fourth switches ON and OFF, for example. Here, the first and second switches may be configured to switch ON and OFF in a complementary manner relative to the third and fourth switches.

Furthermore, the switch circuit may include a first diode and a first switch that connect the supplementary bootstrap capacitor in parallel to power supply lines for the high-side driver circuit when the charge voltage of the bootstrap capacitor decreases to less than the prescribed voltage while the high-side switching device is ON, and a second diode switch and a second switch that apply the charging voltage to the supplementary bootstrap capacitor when the high-side switching device is ON and the charge voltage of the bootstrap capacitor is above the prescribed voltage, and the first diode becomes conductive when the charge voltage of the supplementary bootstrap capacitor exceeds the charge voltage of the bootstrap capacitor, and the second diode becomes conductive when the charge voltage of the supplementary bootstrap capacitor becomes less than a voltage regulated by the Zener diode.

In addition, the semiconductor device configured as described above can further include fifth and sixth switches that isolate the bootstrap capacitor from the power supply that supplies the driving power to the low-side driver circuit when the first and second switches are ON; and seventh and eighth switches that conduct current in a complementary manner relative to the fifth and sixth switches and that apply the charging voltage to the bootstrap capacitor. In this case, the fifth to eighth switches may also be implemented using bidirectional analog switches.

In this case, a cathode of the Zener diode may be connected to the intermediate node, for example. Moreover, an anode of the Zener diode may regulate a voltage on a negative side relative to the intermediate voltage, and a voltage between the anode and the cathode of the Zener diode may be the charging voltage.

As described above, the semiconductor device according to the present disclosure includes the supplementary bootstrap capacitor which is charged when the high-side switching device is ON in addition to the bootstrap capacitor which is charged when the low-side switching device is ON. Moreover, when the ON time of the high-side switching device is long, the charge voltage of the supplementary bootstrap capacitor is used to compensate for any decrease in the voltage applied to the high-side driver circuit from the bootstrap capacitor.

Therefore, even when the ON time of the high-side switching device is long, the semiconductor device configured as described above makes it possible to stably supply the supply voltage that the high-side switching device needs in order to operate. This achieves various advantageous effects in practical applications, such as making it possible to guarantee stable operation of the high-side driver circuit while maintaining a simple configuration and without affecting the ON/OFF conditions for the high-side switching device.

Furthermore, in the configuration described above, the high-side driver circuit operates using the voltage of the node as an operating reference voltage. This makes it possible to configure the bootstrap circuit in a low-cost manner, without having to use expensive high breakdown voltage devices as disclosed in Patent Document 3. Moreover, the control circuit which respectively controls the ON/OFF operation of the first to fourth switches can similarly be configured in a simple manner as a control logic circuit, for example, which exhibits additional advantageous effects such as making it possible to reduce this aspect of the cost of the semiconductor device as well.

In addition, the semiconductor device configured to further include the fifth to eighth switches makes it possible to charge the supplementary bootstrap capacitor independently of the charging/discharging of the bootstrap capacitor. Moreover, this configuration makes it possible to recharge the bootstrap capacitor once the charge voltage of the bootstrap capacitor decreases and the charge voltage of the supplementary bootstrap capacitor is therefore being applied to the high-side driver circuit. Therefore, even when the ON time of the high-side switching device is long, it is possible to quickly restore the functionality of the bootstrap capacitor and to thereby stably supply a supply voltage to the high-side driver circuit.

It is to be understood that both the foregoing general description and the following detailed description are exemplary and explanatory, and are intended to provide further explanation of the invention as claimed.

DETAILED DESCRIPTION OF EMBODIMENTS

Next, embodiments of the present invention will be described with reference to figures.

Figure 1:
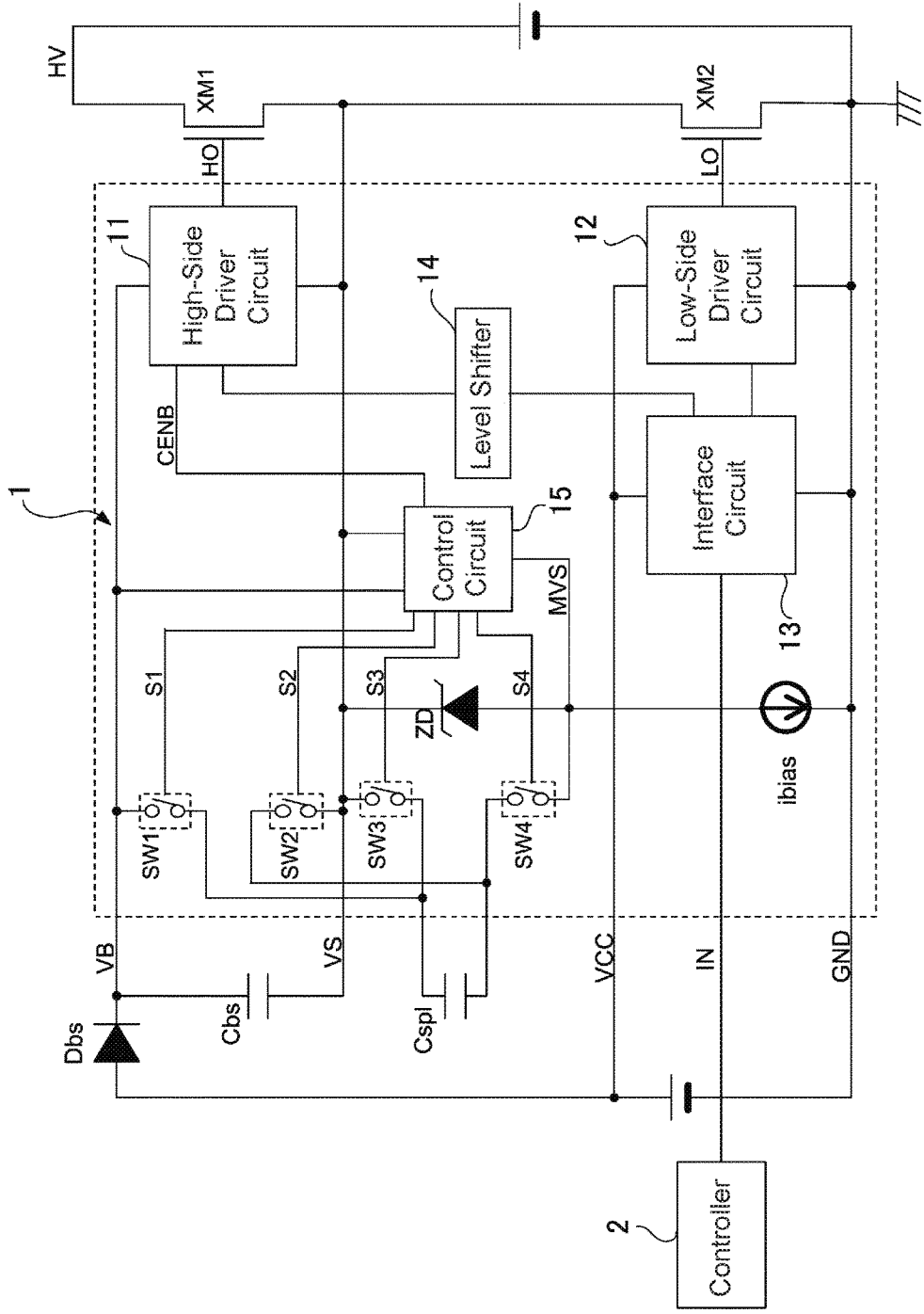
FIG. 1 schematically illustrates a configuration of a semiconductor device according to Embodiment 1 of the present invention.
Figure 11:
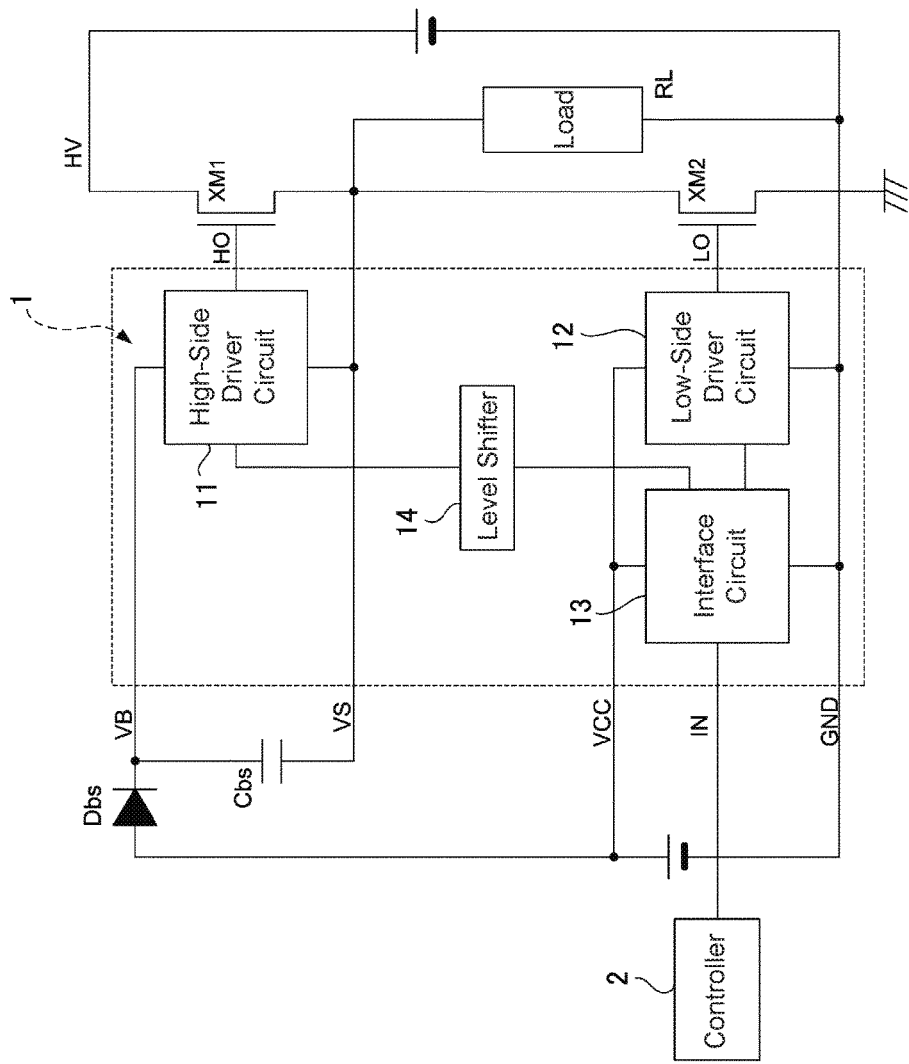
FIG. 11 schematically illustrates the configuration of a typical conventional semiconductor device including a high-side driver circuit and a low-side driver circuit which respectively drive a totem pole-connected high-side switching device and low-side switching device.
Figure 12:
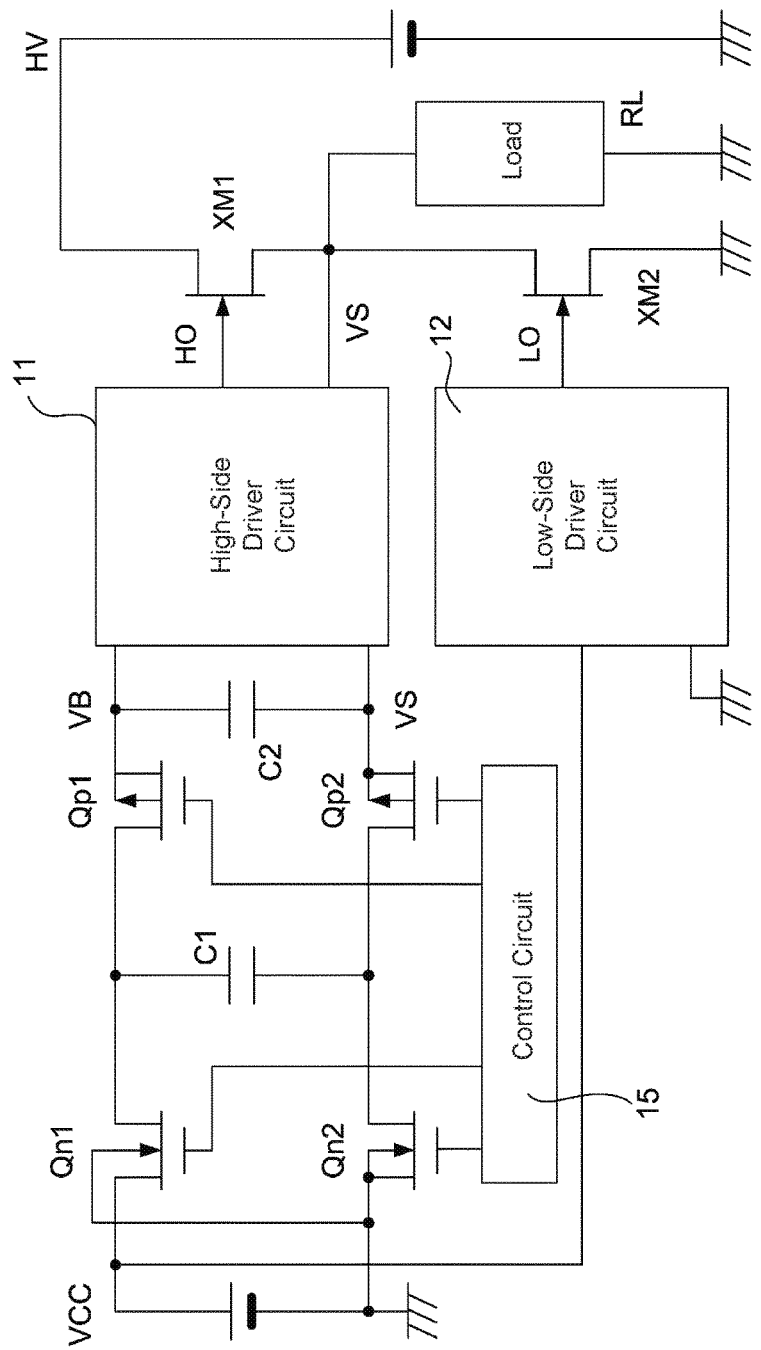
FIG. 12 illustrates an example of a conventional semiconductor device configured to stably supply power to a high-side driver circuit regardless of whether a low-side switching device is ON or OFF.

FIG. 1 schematically illustrates a configuration of a semiconductor device 1 according to Embodiment 1 of the present invention. Note that the embodiments of the present invention will be described using the same reference characters for components that are the same as in the conventional semiconductor device 1 illustrated in FIG. 11.

The semiconductor device 1 according to the present invention basically includes a high-side driver circuit 11 and a low-side driver circuit 12 which drive a totem pole-connected high-side switching device XM1 and low-side switching device XM2 in a complementary manner, and a bootstrap capacitor Cbs connected to a driving power supply for the low-side driver circuit 12 via a bootstrap diode Dbs.

One end of the bootstrap capacitor Cbs is connected to a series connection node between the high-side switching device XM1 and the low-side switching device XM2, and the other end is connected to the cathode of the bootstrap diode Dbs. Therefore, when the low-side switching device XM2 is ON, the bootstrap capacitor Cbs is charged via the bootstrap diode Dbs by a supply voltage VCC relative to a ground voltage GND as a reference voltage. When the low-side switching device XM2 switches OFF, the voltage charged in the bootstrap capacitor Cbs is boosted (bootstrapped) to a voltage referenced to a voltage VS of the series connection node between the high-side switching device XM1 and the low-side switching device XM2. The charge voltage of the bootstrap capacitor Cbs boosted in this manner is applied to the high-side driver circuit 11 as a supply voltage VB.

One characterizing feature of the semiconductor device 1 according to Embodiment 1 is the inclusion of a supplementary bootstrap capacitor Cspl connected in parallel to the bootstrap capacitor Cbs via a switch circuit constituted by first to fourth switches SW1 to SW4. Here, the first to fourth switches SW1 to SW4 are bidirectional analog switches (transmission gates) or the like. The first and second switches SW1 and SW2 switch ON and OFF in unison with one another under the control of a control circuit 15, and similarly, the third and fourth switches SW3 and SW4 switch ON and OFF in unison with one another under the control of the control circuit 15.

More specifically, one end of the supplementary bootstrap capacitor Cspl is connected via the first switch SW1 to the cathode of the bootstrap diode Dbs (the other end side of the bootstrap capacitor Cbs), and the other end of the supplementary bootstrap capacitor Cspl is connected via the second switch SW2 to the series connection node between the high-side switching device XM1 and the low-side switching device XM2 (the one end side of the bootstrap capacitor Cbs). Meanwhile, the one end of the supplementary bootstrap capacitor Cspl is also connected via the third switch SW3 to the series connection node between the high-side switching device XM1 and the low-side switching device XM2 (the one end side of the bootstrap capacitor Cbs), and the other end of the supplementary bootstrap capacitor Cspl is also connected via the fourth switch SW4 to a reference voltage MVS. The reference voltage MVS is connected via a constant current source ibias to the ground voltage GND.

Moreover, a Zener diode ZD is inserted between the one end of the bootstrap capacitor Cbs and the constant current source ibias. As described below, the terminal voltage (and more specifically, the breakdown voltage) of this Zener diode ZD becomes a charging reference voltage that charges the supplementary bootstrap capacitor Cspl.

Here, when the low-side switching device XM2 is OFF and the high-side switching device XM1 is ON, the third and fourth switches SW3 and SW4 are switched to the conducting (ON) state and charge the supplementary bootstrap capacitor Cspl. At this time, the Zener diode ZD undergoes breakdown due to the high-voltage DC voltage HV being applied to its cathode, and this breakdown voltage is applied to the supplementary bootstrap capacitor Cspl as the charging reference voltage. Moreover, when the low-side switching device XM2 is OFF and the supply voltage VB supplied to the high-side driver circuit 11 from the bootstrap capacitor Cbs decreases to a prescribed voltage set in advance to be near the minimum voltage that guarantees operation of the high-side driver circuit 11, the first and second switches SW1 and SW2 are switched to the conducting (ON) state. When the first and second switches SW1 and SW2 switch ON, the discharge of the charge voltage from the supplementary bootstrap capacitor Cspl compensates for any decrease in the supply voltage VB, thereby preventing a decrease in the supply voltage VB supplied to the high-side driver circuit 11. At this time, the third and fourth switches SW3 and SW4 are OFF.

The control circuit 15 which controls the ON/OFF operation of the first to fourth switches SW1 to SW4 as described above is configured as illustrated in FIG. 2, for example. This control circuit 15 obtains the reference voltage MVS from the anode of the Zener diode ZD. The reference voltage MVS becomes equal to the intermediate voltage VS minus the breakdown voltage of the Zener diode ZD when the Zener diode ZD undergoes breakdown and becomes equal to the ground voltage GND when the Zener diode is not undergoing breakdown. Moreover, the breakdown voltage of the Zener diode ZD is set such that the Zener diode ZD undergoes breakdown when the high-side switching device XM1 switches ON while the low-side switching device XM2 is OFF.

Here, the high-side driver circuit 11 operates using the intermediate voltage VS as an operating reference voltage. The control circuit 15 includes an input circuit 15a which takes as input a signal CENB output by the high-side driver circuit 11 in accordance with the high-side switching device XM1 switching ON and which converts this signal to an ON signal CEN for which the reference voltage MVS of the control circuit 15 is the L level. The control circuit 15 further includes a voltage decrease detector 16 which, using the intermediate voltage VS as a reference voltage, detects decreases in the supply voltage VB (that is, decreases in the VB-VS voltage). This voltage decrease detector 16 outputs a voltage decrease detection signal when the supply voltage VB decreases to a prescribed voltage set in advance to be near the minimum voltage that guarantees operation of the high-side driver circuit 11. The detection signal output from the voltage decrease detector 16 when the supply voltage VB decreases is converted by an input circuit 15b to a voltage decrease signal UVEN for which the reference voltage MVS is the L level.

Figure 3:
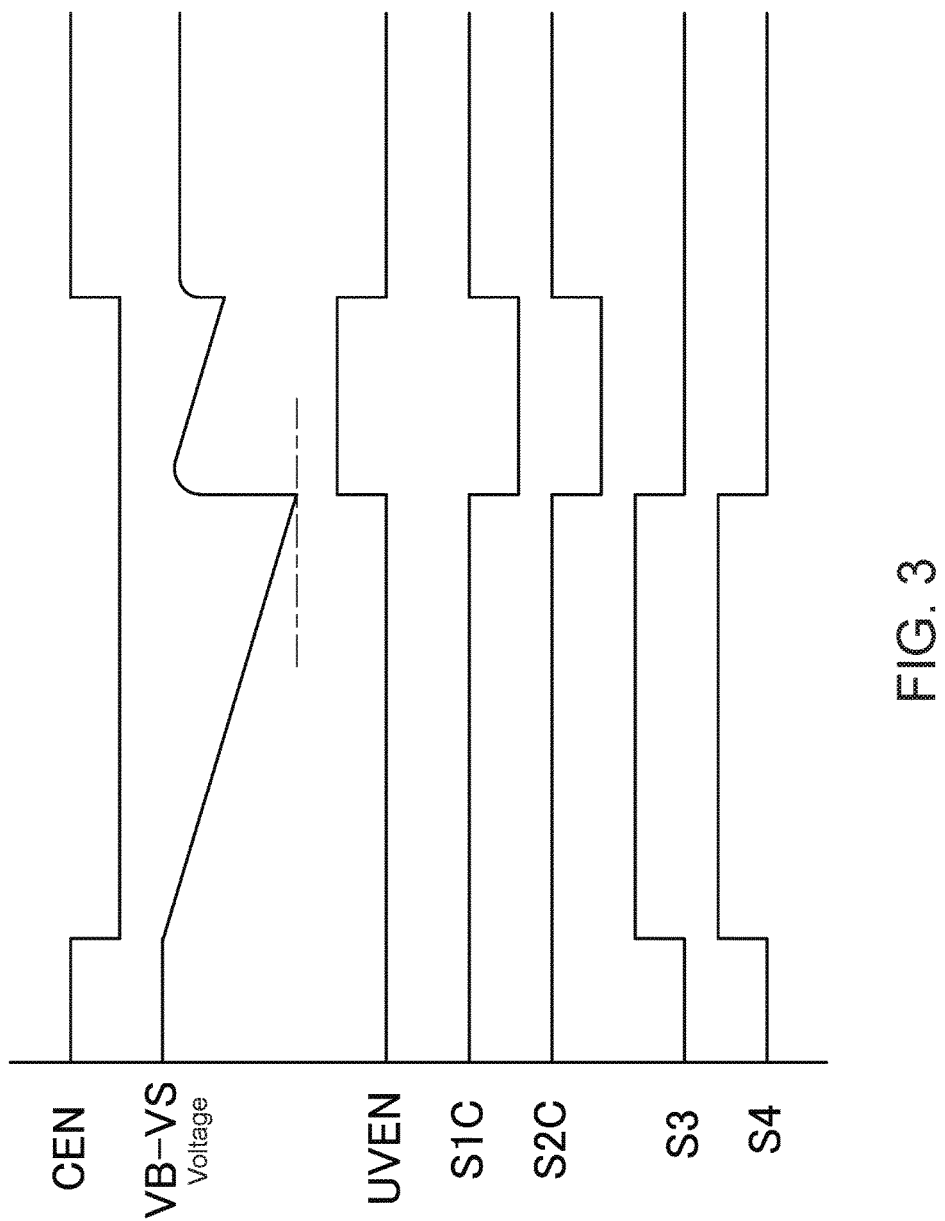
FIG. 3 is a timing diagram illustrating the operation of the control circuit illustrated in FIG. 2.

Furthermore, a control logic circuit 15c included in the control circuit 15 operates using the reference voltage MVS as an operating reference voltage and using the intermediate voltage VS as a supply voltage. Moreover, as illustrated in FIG. 3, for example, the control logic circuit 15c, in accordance with the ON signal CEN and the voltage decrease signal UVEN, generates switching signals S1C, S2C, S3 and S4 for respectively switching the first to fourth switches SW1 to SW4 ON and OFF.

In particular, the control logic circuit 15c generates the switching signals S1C and S2C only when the supply voltage VB as referenced to the intermediate voltage VS (that is, the VB-VS voltage) decreases to a voltage that guarantees operation of the high-side driver circuit 11. More specifically, the control logic circuit 15c, in accordance with the ON signal CEN and the voltage decrease signal UVEN, outputs the switching signals S1C and S2C when the VB-VS voltage decreases while the high-side switching device XM1 is in the ON state.

It should be noted that the ON signal CEN is not necessarily required for the control logic circuit 15c to operate. This is because during the period in which the signal CENB is at the H level, in general the low-side switching device XM2 switches ON and causes the intermediate voltage VS to become equal to the ground voltage GND, which results in no power being supplied to the control logic circuit 15c, and therefore it is meaningless to communicate to the control logic circuit 15c that the signal CENB is at the H level. However, in order to define the behavior for periods of dead time during which the high-side switching device XM1 and the low-side switching device XM2 are both OFF, it is better that the ON signal CEN be provided.

Here, the switching signals S1C and S2C generated by the control logic circuit 15c are negative logic signals for switching ON the first and second switches SW1 and SW2 when at the L level. These switching signals S1C and S2C are, via output circuits 15d and 15e, converted to signals which are set to either the supply voltage VB or the intermediate voltage VS and then respectively applied to the first and second switches SW1 and SW2. The switching signals S3 and S4 are positive logic signals for switching ON the third and fourth switches SW3 and SW4 when at the H level. These switching signals S3 and S4 are respectively applied to the third and fourth switches SW3 and SW4 as signals which are set to either the intermediate voltage VS or the reference voltage MVS.

Furthermore, while the signal CENB is at the L level, the first and second switches SW1 and SW2 switch ON and OFF in a complementary manner relative to the third and fourth switches SW3 and SW4 in order to prevent short-circuits between the supply voltage VB and the intermediate voltage VS as well as short-circuits between the intermediate voltage VS and the reference voltage MVS.

Figure 2:
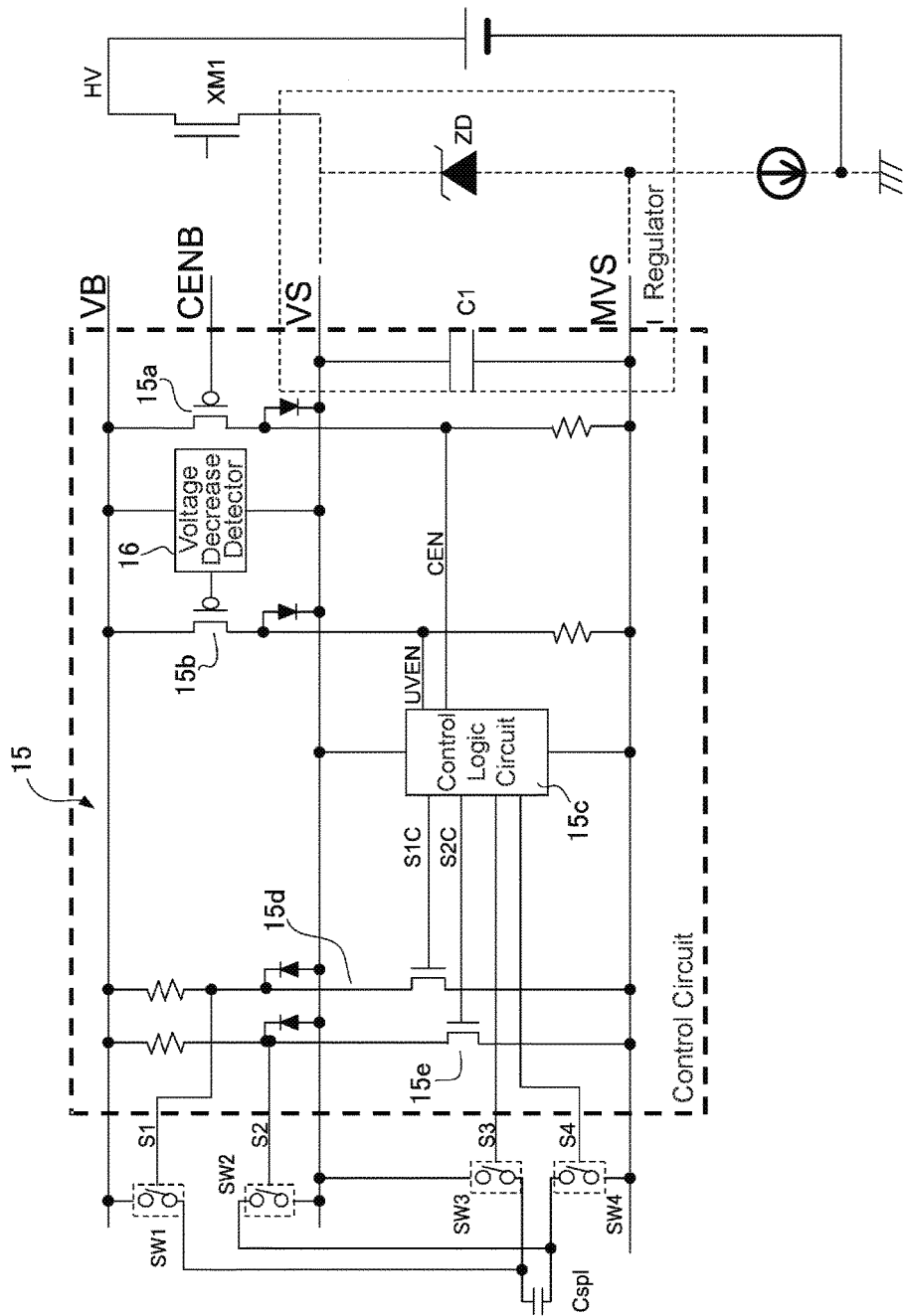
FIG. 2 illustrates an example of a configuration of a control circuit in the semiconductor device illustrated in FIG. 1.

Moreover, in FIG. 2, C1 is a smoothing capacitor for smoothing the VS-MVS voltage (which is clamped by the breakdown voltage of the Zener diode ZD) and bringing that voltage into the control circuit 15. Together, this smoothing capacitor C1 and the Zener diode ZD form a voltage regulator for stabilizing the reference voltage MVS for the control circuit 15.

Figure 4:
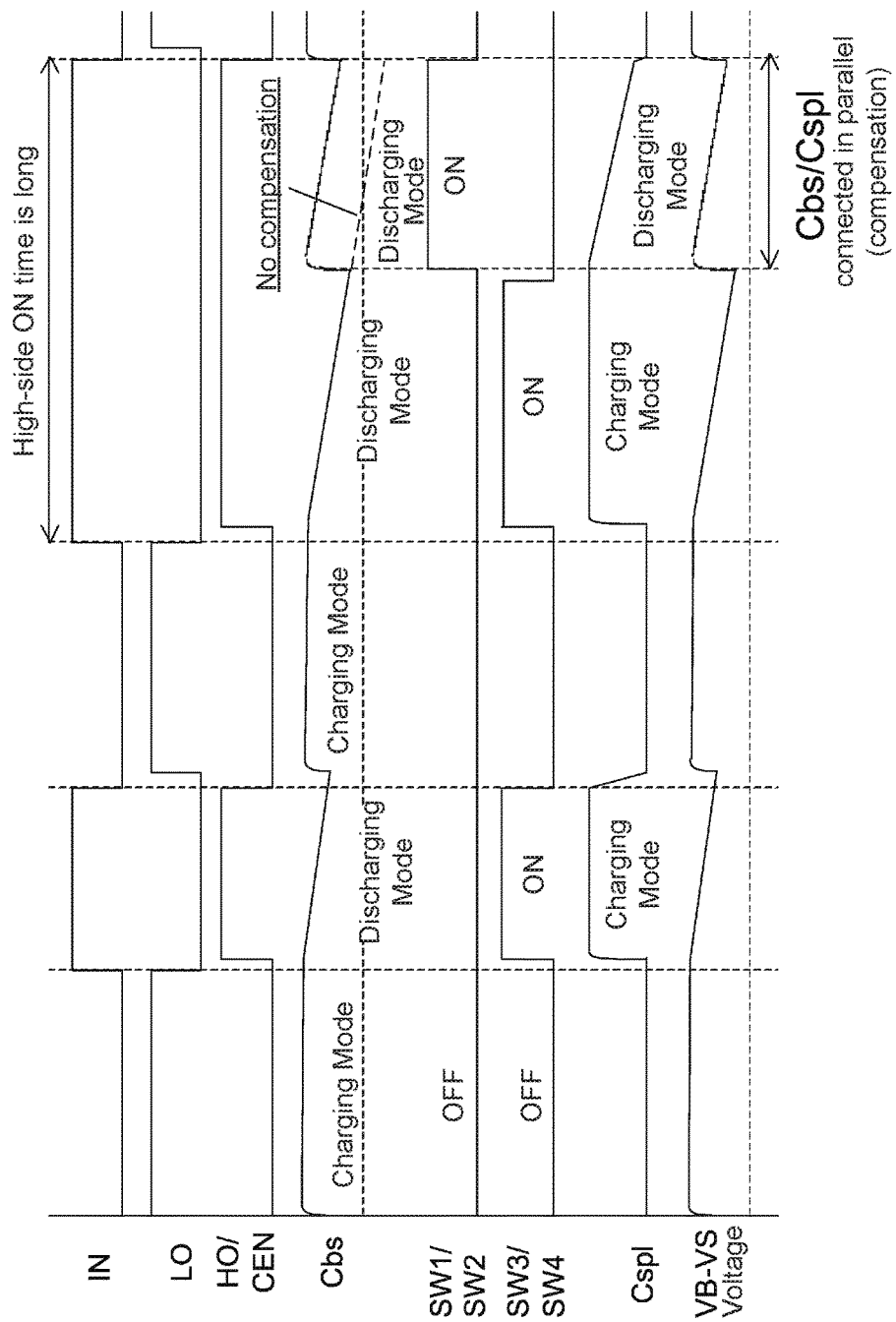
FIG. 4 is a timing diagram illustrating bootstrap operation in the semiconductor device illustrated in FIG. 1.

FIG. 4 is a timing diagram illustrating bootstrap operation in the semiconductor device 1 configured as described above. That is, FIG. 4 illustrates how the first to fourth switches SW1 to SW4 switch ON and OFF during operation of the high-side driver circuit 11 and the low-side driver circuit 12 which switch the switching devices XM1 and XM2 ON and OFF in a complementary manner, as well as how the bootstrap capacitor Cbs and the supplementary bootstrap capacitor Cspl charge and discharge at these times.

As illustrated in FIG. 4, as the low-side switching device XM2 switches ON and OFF, the bootstrap capacitor Cbs is charged by the supply voltage VCC when the low-side switching device XM2 is ON. Furthermore, the charge voltage (charge) of the bootstrap capacitor Cbs is discharged to supply power to the high-side driver circuit 11 when the low-side switching device XM2 is OFF. At this time, the supply voltage VB supplied to the high-side driver circuit 11 by the discharge of the bootstrap capacitor Cbs is a voltage in which the supply voltage VCC is boosted (bootstrapped) by exactly the intermediate voltage VS as the low-side switching device XM2 switches OFF and the high-side switching device XM1 switches ON.

Meanwhile, when the high-side switching device XM1 switches ON and the intermediate voltage VS of the series connection node between the high-side switching device XM1 and the low-side switching device XM2 takes a high voltage, the supplementary bootstrap capacitor Cspl is charged by the VS-MVS voltage (that is, the charging reference voltage) which is clamped by the breakdown voltage of the Zener diode ZD. Here, the VS-MVS voltage which is clamped by the Zener diode ZD is a voltage corresponding to the supply voltage VCC which drives the low-side driver circuit 12. In other words, the supplementary bootstrap capacitor Cspl receives and is charged by the intermediate voltage VS (which is applied via the high-side switching device XM1) independently of the bootstrap capacitor Cbs, which receives and is charged by supply voltage VCC.

Furthermore, when the remaining charge of the bootstrap capacitor Cbs becomes insufficient due to discharge of the bootstrap capacitor Cbs (which is the supply source for the supply voltage VB) and the supply voltage VB applied to the high-side driver circuit 11 decreases as a result, the charge stored in the supplementary bootstrap capacitor Cspl is discharged. This discharge of the supplementary bootstrap capacitor Cspl compensates for the decrease in the supply voltage VB applied to the high-side driver circuit 11, thereby maintaining the supply voltage VB required for the high-side driver circuit 11 to operate.

Therefore, even when the ON time of the high-side switching device XM1 is long, it is possible to maintain the supply voltage VB required for the high-side driver circuit 11 to operate, and to do so without imposing any restrictions on the charge capacity of the bootstrap capacitor Cbs. In particular, it is possible to use the supplementary bootstrap capacitor Cspl to resolve any insufficiency in the charge capacity of the bootstrap capacitor Cbs, thereby making it possible to simply and effectively address this issue even when the ON time of the high-side switching device XM1 is long.

In terms of preventing the supply voltage VB generated by the bootstrap capacitor Cbs from decreasing when the ON time of the high-side switching device XM1 is long, it would be conceivable to increase the capacity of the bootstrap capacitor Cbs itself, for example. Alternatively, it would be conceivable to connect a supplementary bootstrap capacitor Cspl to the bootstrap capacitor Cbs in parallel in order to increase the resulting combined capacity. However, because the bootstrap capacitor Cbs is charged when the low-side switching device XM2 is ON, in these cases it might potentially not be possible to sufficiently charge the bootstrap capacitor Cbs.

In this respect, in the semiconductor device 1 configured as described above, the supplementary bootstrap capacitor Cspl is charged when the low-side switching device XM2 is OFF and the high-side switching device XM1 is ON. In other words, the supplementary bootstrap capacitor Cspl is charged independently of the charging/discharging of the bootstrap capacitor Cbs, and decreases in the supply voltage VB are prevented by discharging the supplementary bootstrap capacitor Cspl only when the supply voltage VB decreases. Therefore, even if the ON time of the low-side switching device XM2 is short, it is possible to store enough charge in the bootstrap capacitor Cbs and/or the supplementary bootstrap capacitor Cspl to stably supply the supply voltage VB. As a result, even when the ON/OFF times of the switching devices XM1 and XM2 vary significantly, it is possible to stably generate the supply voltage VB, thereby making it possible to stabilize the operation of the semiconductor device 1.

Furthermore, in the semiconductor device 1 configured as described above, the VS-MVS voltage is clamped by the Zener diode ZD, thereby limiting the charge voltage of the supplementary bootstrap capacitor Cspl. This makes it possible to configure the control circuit 15 in a simple and low-cost manner, without having to use high breakdown voltage devices as in the circuit disclosed in Patent Document 3. Moreover, the bidirectional analog switches used for the first to fourth switches SW1 to SW4 do not need to be high breakdown voltage devices either, thereby achieving advantageous effects such making it possible to configure the overall semiconductor device 1 at low cost.

Next, Embodiment 2 of the present invention will be described.

Figure 5:
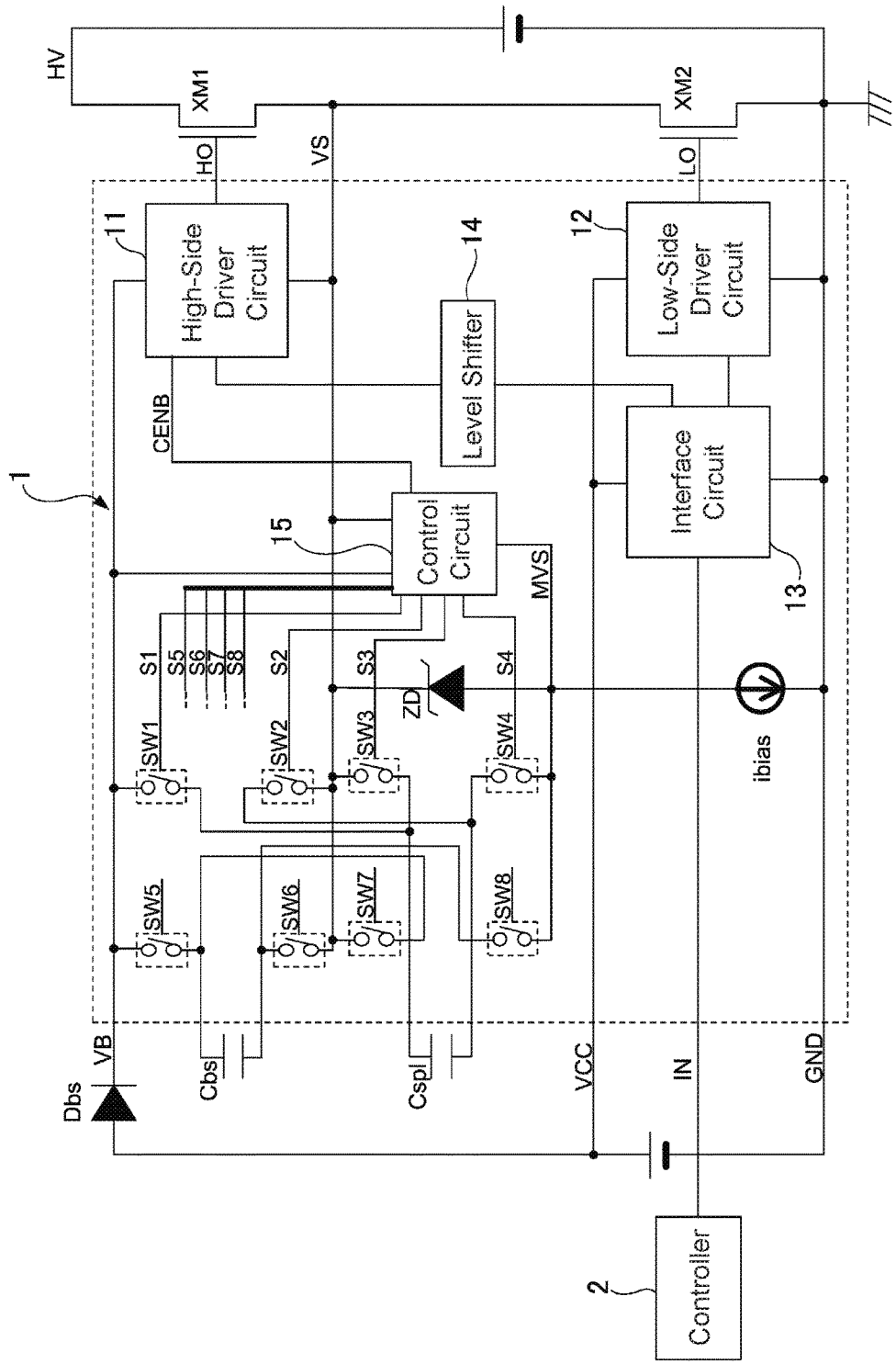
FIG. 5 schematically illustrates a configuration of a semiconductor device according to Embodiment 2 of the present invention.

FIG. 5 schematically illustrates a configuration of a semiconductor device 1 according to Embodiment 2 of the present invention. In the semiconductor device 1 according to Embodiment 2, fifth to eighth switches SW5 to SW8 are added to the configuration of the semiconductor device 1 according to the above-described Embodiment 1 and are configured so as to selectively connect the bootstrap capacitor Cbs and the supplementary bootstrap capacitor Cspl between the cathode of the bootstrap diode Dbs and the series connection node of the switching devices XM1 and XM2 or between the series connection node of the switching devices XM1 and XM2 and the ground voltage GND. Here, similar to the first to fourth switches SW1 to SW4, the fifth to eighth switches SW5 to SW8 are switched ON and OFF in conjunction with one another under the control of a control circuit 15. Moreover, the fifth to eighth switches SW5 to SW8 are bidirectional analog switches (transmission gates) or the like.

More specifically, one end of the bootstrap capacitor Cbs is connected via the fifth switch SW5 to the cathode of the bootstrap diode Dbs, and the other end is connected via the sixth switch SW6 to the series connection node between the high-side switching device XM1 and the low-side switching device XM2. Meanwhile, the one end of the bootstrap capacitor Cbs is also connected via the seventh switch SW7 to the series connection node between the high-side switching device XM1 and the low-side switching device XM2, and the other end is also connected via the eighth switch SW8 to the reference voltage MVS. The reference voltage MVS is connected via the constant current source ibias to the ground voltage GND.

These fifth to eighth switches SW5 to SW8 are switched ON and OFF in conjunction with the first to fourth switches SW1 to SW4 by the control circuit 15, thereby alternately charging and discharging the bootstrap capacitor Cbs and the supplementary bootstrap capacitor Cspl.

Figure 6:
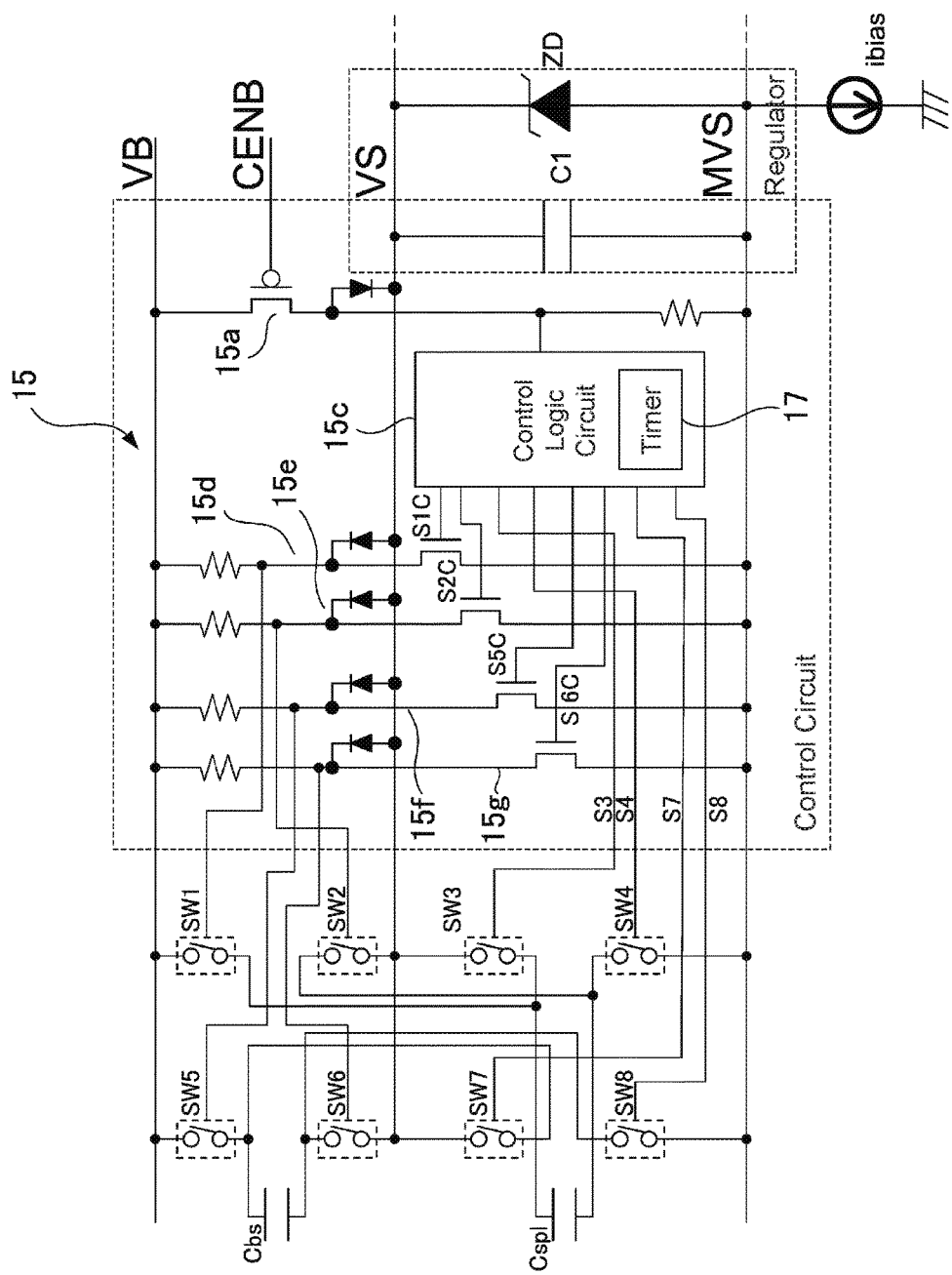
FIG. 6 illustrates an example of a configuration of a control circuit in the semiconductor device illustrated in FIG. 5.

Here, the control circuit 15 which switches the first to eighth switches SW1 to SW8 ON and OFF is configured as illustrated in FIG. 6, for example. This control circuit 15 includes a timer 17 within the control logic circuit 15c instead of the voltage decrease detector 16 described above. This timer 17 measures the ON time of the high-side switching device XM1 and generates a voltage detection signal UVEN (not illustrated in FIG. 6) when the ON time exceeds a prescribed time.

In other words, the supply voltage VB supplied to the high-side driver circuit 11 from the bootstrap capacitor Cbs depends on the ON time of the high-side switching device XM1 and decreases as the discharge time of the bootstrap capacitor Cbs increases in length. The timer 17 generates the voltage detection signal UVEN by detecting the extent of the decrease in the supply voltage VB attributed to the discharge by the bootstrap capacitor Cbs in terms of the length of the ON time of the high-side switching device XM1.

Figure 7:
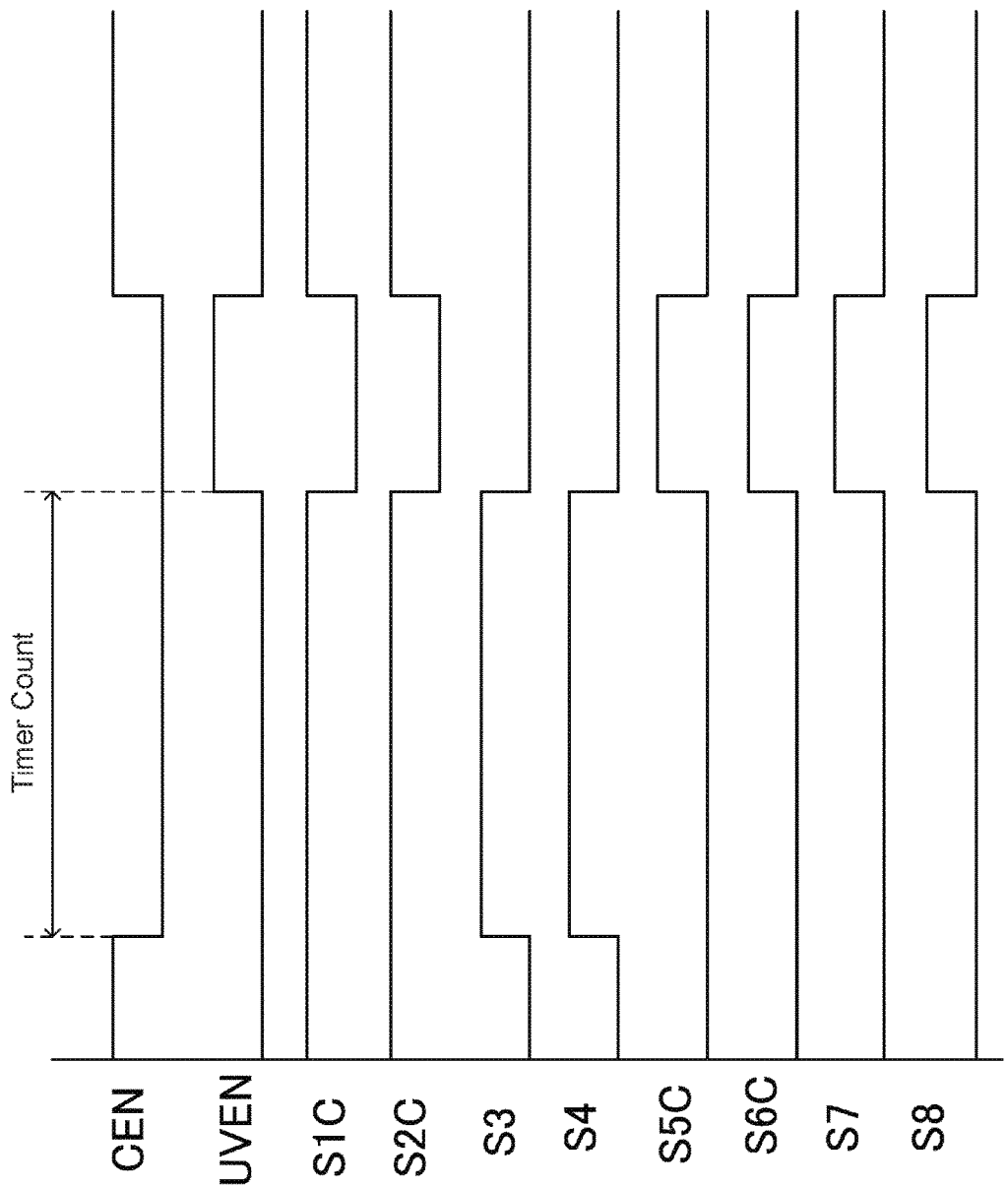
FIG. 7 is a timing diagram illustrating the operation of the control circuit illustrated in FIG. 6.

Furthermore, as illustrated in FIG. 7, for example, the control logic circuit 15c is configured to, in accordance with the ON signal CEN and the voltage detection signal UVEN, generate switching signals S1C, S2C, S3 and S4 for respectively switching the first to fourth switches SW1 to SW4 ON and OFF as well as switching signals S5C, S6C, S7 and S8 for respectively switching the fifth to eighth switches SW5 to SW8 ON and OFF.

Here, the switching signals S1C, S2C, S5C and S6C generated by the control logic circuit 15c are negative logic signals for respectively switching ON the first, second, fifth, and sixth switches SW1, SW2, SW5 and SW6 when at the L level. These switching signals S1C, S2C, S5C and S6C are, via output circuits 15d, 15e, 15f, and 15g, converted to signals which are set to either the supply voltage VB or the intermediate voltage VS and then respectively applied to the first, second, fifth, and sixth switches SW1, SW2, SW5 and SW6.

Moreover, the switching signals S3, S4, S7 and S8 are positive logic signals for respectively switching ON the third, fourth, seventh, and eighth switches SW3, SW4, SW7 and SW8 when at the H level. These switching signals S3, S4, S7 and S8 are respectively applied to the third, fourth, seventh, and eighth switches SW3, SW4, SW7 and SW8 as signals which are set to either the intermediate voltage VS or the reference voltage MVS.

Figure 8:
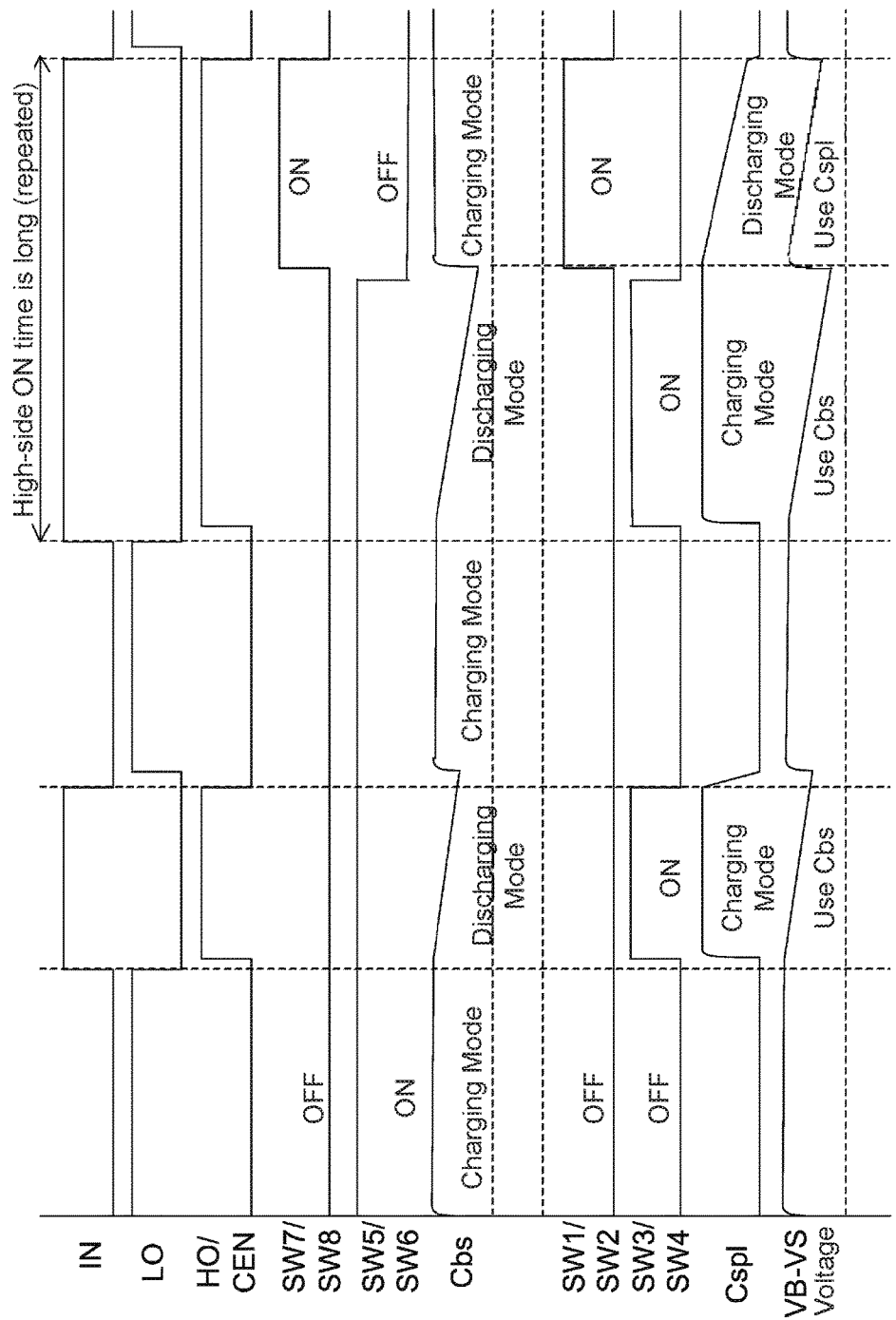
FIG. 8 is a timing diagram illustrating bootstrap operation in the semiconductor device illustrated in FIG. 5.

FIG. 8 is a timing diagram illustrating bootstrap operation in the semiconductor device 1 configured as described above. In other words, FIG. 8 illustrates how the first to eighth switches SW1 to SW8 switch ON and OFF during operation of the high-side driver circuit 11 and the low-side driver circuit 12 which switch the switching devices XM1 and XM2 ON and OFF in a complementary manner, as well as how the bootstrap capacitor Cbs and the supplementary bootstrap capacitor Cspl charge and discharge at these times.

As illustrated in FIG. 8, in the semiconductor device 1 configured as described above, in accordance with ON and OFF of the low-side switching device XM2, the bootstrap capacitor Cbs is charged by the supply voltage VCC when the low-side switching device XM2 is ON. Furthermore, when the low-side switching device XM2 is OFF and the high-side switching device XM1 is ON, the charge voltage of the bootstrap capacitor Cbs is boosted (bootstrapped) and supplied to the high-side driver circuit 11. Moreover, similar to in Embodiment 1, the supplementary bootstrap capacitor Cspl receives and is charged by the VS-MVS voltage independently of the bootstrap capacitor Cbs, which receives and is charged by the supply voltage VCC.

In addition, when the timer 17 indicates that the supply voltage VB has decreased, the charge stored in the supplementary bootstrap capacitor Cspl is discharged via the first and second switches SW1 and SW2 and supplied to the high-side driver circuit 11 as the supply voltage VB. At this time, the bootstrap capacitor Cbs is isolated from the high-side driver circuit 11 by the fifth and sixth switches SW5 and SW6 and is also connected to the series connection node of the switching devices XM1 and XM2 and to the reference voltage MVS via the seventh and eighth switches SW7 and SW8.

As a result, the supply voltage VB is applied to the high-side driver circuit 11 from the supplementary bootstrap capacitor Cspl instead of from the bootstrap capacitor Cbs. Moreover, while the supplementary bootstrap capacitor Cspl is discharging, the bootstrap capacitor Cbs receives and is recharged by the VS-MVS voltage. Therefore, in the semiconductor device 1 that operates in this manner, similar to in the semiconductor device 1 described as Embodiment 1, it is again possible to stably supply the supply voltage VB to the high-side driver circuit 11 even when the ON time of the high-side switching device XM1 is long. Furthermore, the bootstrap capacitor Cbs is charged while the supplementary bootstrap capacitor Cspl discharges, thereby making it possible to reliably charge the bootstrap capacitor Cbs even when the ON time of the low-side switching device XM2 is short.

In addition, the timer 17 is restarted when the supply voltage VB starts being supplied from the supplementary bootstrap capacitor Cspl instead of from the bootstrap capacitor Cbs. Moreover, when a decrease in the voltage of the supplementary bootstrap capacitor Cspl is detected from the count kept by the timer 17, the supply voltage VB starts being supplied from the bootstrap capacitor Cbs again instead of from the supplementary bootstrap capacitor Cspl. Continuing to then similarly alternate between supplying the supply voltage VB from the bootstrap capacitor Cbs and supplying the supply voltage VB from the supplementary bootstrap capacitor Cspl makes it possible to handle any ON time for the high-side switching device XM1.

Therefore, although in comparison to Embodiment 1 the fifth to eighth switches SW5 to SW8 are additionally required, this configuration exhibits advantageous effects such as more flexibly handling changes in the ON/OFF times of the switching devices XM1 and XM2 and thereby stably generating the supply voltage VB and making it possible to stabilize the operation of the semiconductor device 1.

Figure 9:
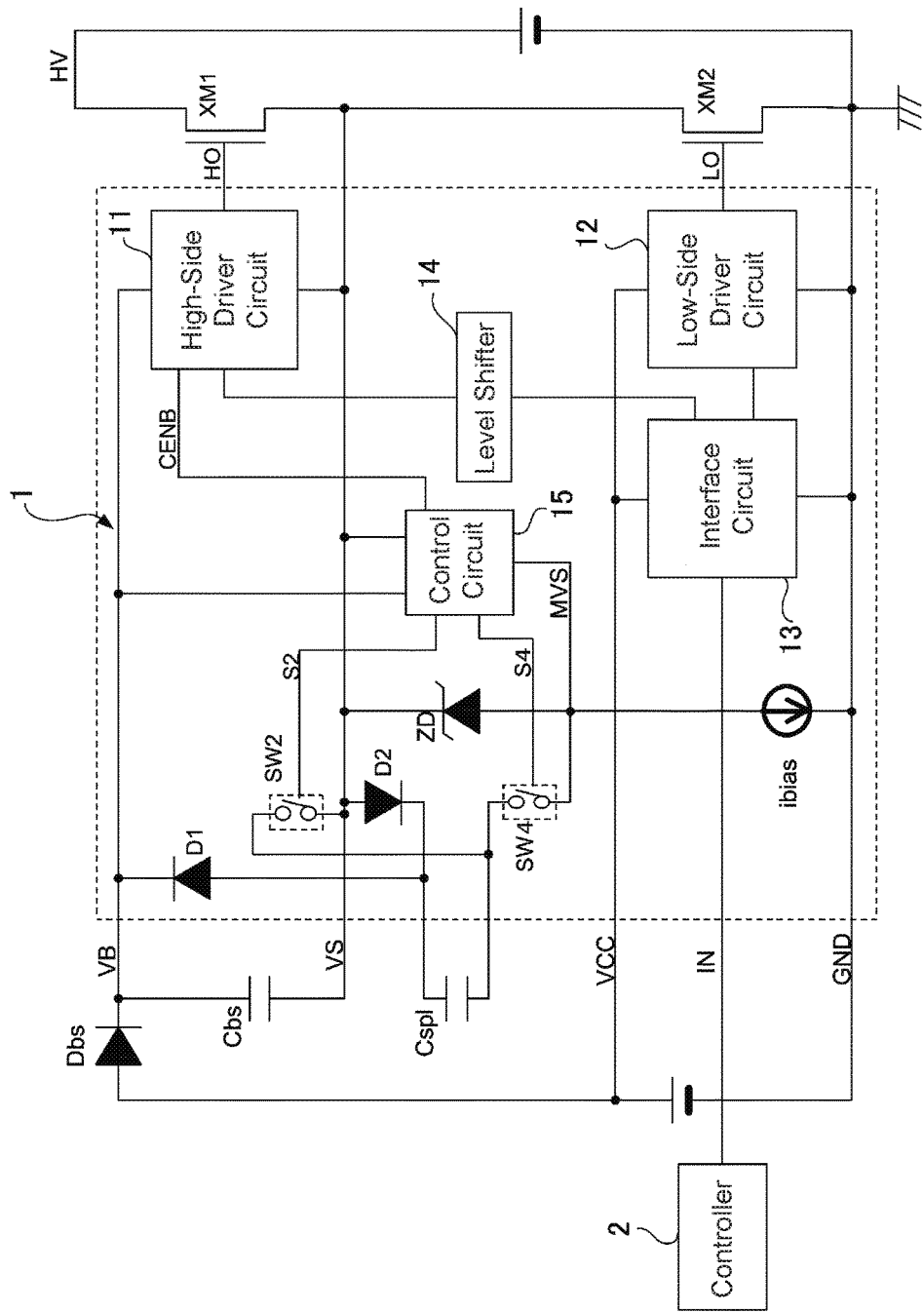
FIG. 9 schematically illustrates a configuration of a semiconductor device according to Embodiment 3 of the present invention.

FIG. 9 schematically illustrates a configuration of a semiconductor device 1 according to Embodiment 3 of the present invention. In the semiconductor device 1 according to Embodiment 3, the first and third switches SW1 and SW3 in the semiconductor device 1 of the above-described Embodiment 1 are implemented using diodes D1 and D2, respectively. That is, the anode of the diode D1 is connected to one end of the supplementary bootstrap capacitor Cspl, and the cathode of the diode D1 is connected to the supply line for the supply voltage VB for the high-side driver circuit 11. Moreover, when the second switch SW2 is ON, the voltage difference between the supply voltage VB and a voltage obtained by adding the charge voltage of the supplementary bootstrap capacitor Cspl to the intermediate voltage VS is used to switch the diode D1 ON and OFF and to thereby control discharging of the supplementary bootstrap capacitor Cspl.

Furthermore, the anode of the diode D2 is connected to the series connection node between the switching devices XM1 and XM2, and the cathode of the diode D2 is connected to the one end of the supplementary bootstrap capacitor Cspl. Moreover, when the fourth switch SW4 is ON, the voltage difference between the intermediate voltage VS and a voltage obtained by adding the charge voltage of the supplementary bootstrap capacitor Cspl to the reference voltage MVS is used to switch the diode D2 ON and OFF and to thereby charge the supplementary bootstrap capacitor Cspl when the low-side switching device XM2 is OFF.

Figure 10:
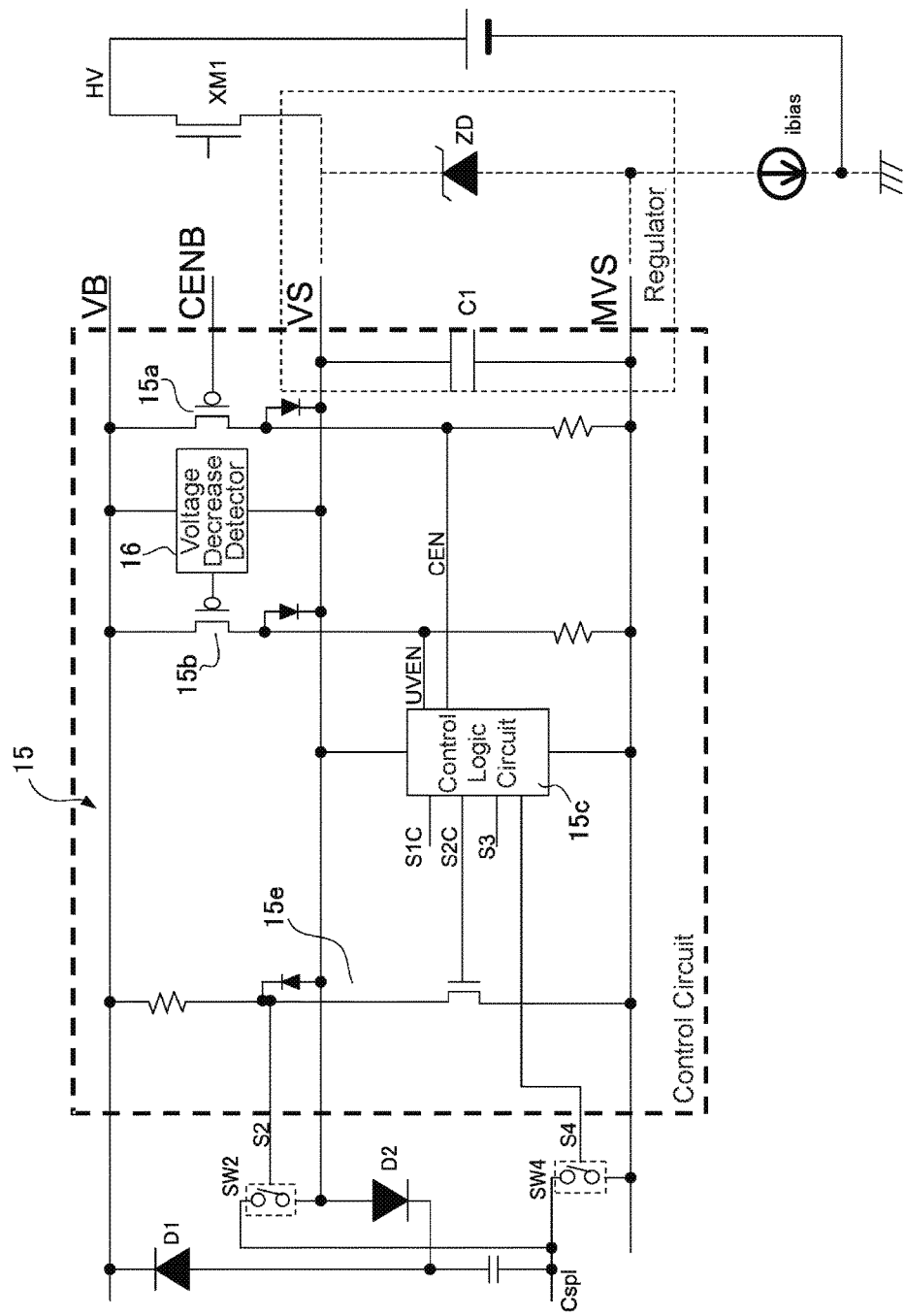
FIG. 10 illustrates an example of a configuration of a control circuit in the semiconductor device illustrated in FIG. 9.

As illustrated in FIG. 10, in a control circuit 15 in the semiconductor device 1 configured using the diodes D1 and D2 as the first and third switches SW1 and SW3, the output circuit 15d can be omitted. Therefore, the semiconductor device 1 according to Embodiment 3 exhibits advantageous effects such as making it possible to simplify the configuration of the control circuit 15, while still operating similarly to the semiconductor device 1 according to Embodiment 1 as described above.

It should be noted that the present invention is not limited to the embodiments described above. For example, the capacities of the bootstrap capacitor Cbs and the supplementary bootstrap capacitor Cspl need only be set so as to account for the amounts of change in the ON/OFF times of the switching devices XM1 and XM2. Moreover, various conventional circuit configurations can be used as appropriate for the voltage decrease detector 16. Furthermore, the control logic circuit 15c can be configured using various logic gate circuits, for example. In addition, various other modifications can be made without departing from the spirit of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device for driving a high-side switching device and a low-side switching device ON and OFF in a complementary manner, the high-side switching device and the low-side switching device being totem pole-connected with a node therebetween to be connected to a load to drive the load, the semiconductor device comprising:
    a high-side driver circuit and a low-side driver circuit which respectively switch the high-side switching device and the low-side switching device ON and OFF in a complementary manner;
    a bootstrap capacitor connected to a power supply that supplies driving power to the low-side driver circuit via a diode such that the bootstrap capacitor is charged when the low-side switching device is ON, and a resulting charge voltage is boosted and applied to the high-side driver circuit when the low-side switching device is OFF;
    a supplementary bootstrap capacitor connected in parallel to the bootstrap capacitor via a switch circuit such that the supplementary bootstrap capacitor is charged by an intermediate voltage at an intermediate node between the high-side and low-side driver circuits that is to be connected to said node between the high-side switching device and the low-side switching device when the high-side switching device is ON;
    a Zener diode that is connected to said intermediate node and that regulates a charging voltage of the supplementary bootstrap capacitor; and
    a control circuit that controls the switch circuit so as to apply a charge voltage of the supplementary bootstrap capacitor to the high-side driver circuit when the charge voltage of the bootstrap capacitor decreases to less than a prescribed voltage while the high-side switching device is ON.

2. The semiconductor device according to claim 1, wherein the high-side driver circuit operates using a voltage of the intermediate node as an operating voltage, and
wherein the Zener diode sets the charging voltage of the supplementary bootstrap capacitor that is charged by the intermediate voltage to a voltage of the power supply that supplies the driving power to the low-side driver circuit.

3. The semiconductor device according to claim 1, wherein the control circuit determines that the charge voltage of the bootstrap capacitor has decreased to less than the prescribed voltage when an ON time of the high-side switching device exceeds a prescribed time.

4. The semiconductor device according to claim 1, wherein the switch circuit includes a first switch and a second switch that connect the supplementary bootstrap capacitor in parallel to power supply lines for the high-side driver circuit when the charge voltage of the bootstrap capacitor decreases to less than the prescribed voltage while the high-side switching device is ON, and a third switch and a fourth switch that apply the charging voltage to the supplementary bootstrap capacitor when the high-side switching device is ON and the first switch and the second switch are OFF.

5. The semiconductor device according to claim 4, wherein each of the first to the fourth switches comprises a bidirectional analog switch.

6. The semiconductor device according to claim 4, wherein the control circuit operates using a voltage of the intermediate node that is to be connected to said node between the totem pole-connected high-side switching device and low-side switching device as an operating supply voltage, and
    wherein the control circuit includes:
        a voltage decrease detector which outputs a voltage decrease detection signal upon detecting a decrease in a supply voltage applied to the high-side driver circuit; and
        a control logic circuit which, on the basis of the voltage decrease detection signal, generates switching signals for respectively switching the first to fourth switches ON and OFF.

7. The semiconductor device according to claim 4, wherein the first switch and the second switch ON and OFF in a complementary manner relative to the third switch and the fourth switch.

8. The semiconductor device according to claim 4, further comprising:
fifth and sixth switches that isolate the bootstrap capacitor from the power supply that supplies the driving power to the low-side driver circuit when the first and second switches are ON; and
seventh and eighth switches that conduct current in a complementary manner relative to the fifth and sixth switches and that apply the charging voltage to the bootstrap capacitor.

9. The semiconductor device according to claim 8, wherein each of the fifth to eighth switches comprises a bidirectional analog switch.

10. The semiconductor device according to claim 1, wherein the switch circuit includes a first diode and a first switch that connect the supplementary bootstrap capacitor in parallel to power supply lines for the high-side driver circuit when the charge voltage of the bootstrap capacitor decreases to less than the prescribed voltage while the high-side switching device is ON, and a second diode switch and a second switch that apply the charging voltage to the supplementary bootstrap capacitor when the high-side switching device is ON and the charge voltage of the bootstrap capacitor is above the prescribed voltage, and
wherein the first diode becomes conductive when the charge voltage of the supplementary bootstrap capacitor exceeds the charge voltage of the bootstrap capacitor, and the second diode becomes conductive when the charge voltage of the supplementary bootstrap capacitor becomes less than a voltage regulated by the Zener diode.

11. The semiconductor device according to claim 1, wherein a cathode of the Zener diode is connected to said intermediate node, an anode of the Zener diode regulates a voltage on a negative side relative to the intermediate voltage, and a voltage between the anode and the cathode of the Zener diode is the charging voltage.

* * * * *